United States Patent
Smith et al.

(10) Patent No.: US 7,116,576 B2
(45) Date of Patent: Oct. 3, 2006

(54) SENSING THE STATE OF A STORAGE CELL INCLUDING A MAGNETIC ELEMENT

(75) Inventors: Kenneth K. Smith, Boise, ID (US); Frederick A. Perner, Santa Barbara, CA (US); Steven C. Johnson, Torrance, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 169 days.

(21) Appl. No.: 10/957,058
(22) Filed: Oct. 1, 2004

(65) Prior Publication Data
US 2005/0041517 A1 Feb. 24, 2005

Related U.S. Application Data

(63) Continuation-in-part of application No. 10/614,581, filed on Jul. 7, 2003, now Pat. No. 6,865,108.

(51) Int. Cl.
*G11C 11/14* (2006.01)
(52) U.S. Cl. .................. 365/171; 365/173; 365/158
(58) Field of Classification Search ............. 365/171, 365/173, 158, 189.04, 189.07
See application file for complete search history.

(56) References Cited

U.S. PATENT DOCUMENTS

| | | | |
|---|---|---|---|
| 6,650,562 B1 | 11/2003 | Holden et al. | |
| 6,728,153 B1 | 4/2004 | Perner et al. | |
| 6,751,147 B1 | 6/2004 | Smith et al. | |
| 6,754,123 B1 | 6/2004 | Perner et al. | |
| 6,791,865 B1* | 9/2004 | Tran et al. | 365/158 |
| 6,980,455 B1* | 12/2005 | Perner | 365/100 |
| 2005/0105329 A1* | 5/2005 | Nazarian | 365/158 |

* cited by examiner

*Primary Examiner*—Anh Phung

(57) ABSTRACT

A storage device includes memory cells each including a magnetic element, where the memory cells include a first memory cell connected between a first voltage and a sense node, and at least second and third memory cells connected in parallel between the sense node and a reference voltage. A sampling circuit is coupled to the sense node, with the sampling circuit configured to receive a first voltage sample corresponding to an original state of the first memory cell, and to store a second voltage sample corresponding to a known state of the first memory cell after the first memory cell has been written to the known state. A differential amplifier compares the first and second voltage samples in their analog forms.

32 Claims, 9 Drawing Sheets

SENSING THE STATE OF A STORAGE CELL INCLUDING A MAGNETIC ELEMENT

CROSS-REFERENCE TO RELATED APPLICATION

This is a continuation-in-part of U.S. Ser. No. 10/614,581, filed Jul. 7, 2003, now U.S. Pat. No. 6,865,108, issued on Mar. 8, 2005, which is hereby incorporated by reference.

BACKGROUND

In computing systems, such as desktop computers, portable computers, personal digital assistants (PDAs), servers, and others, storage devices are used to store data and program instructions. One type of storage device is a disk-based device, such as a magnetic disk drive (e.g., a floppy disk drive or hard disk drive) or an optical disk drive (e.g., a CD or DVD drive). Disk-based storage devices have a rotating storage medium with a relatively large storage capacity. However, disk-based storage devices offer relatively slow read-write speeds when compared to operating speeds of other components of a computing system, such as microprocessors and other semiconductor devices.

Another type of storage device is a solid state storage device, such as a dynamic random access memory (DRAM) device, static random access memory (SRAM) device, flash memory device, and electrically erasable and programmable read-only memory (EEPROM) device. Another variant of a solid state storage device is a magnetoresistive solid state storage device, such as a magnetoresistive random access memory (MRAM) device. A typical MRAM device includes an array of memory cells (each memory cell made up of a magnetoresistive element) that are selected by word lines extending along rows of the memory cells, and bit lines extending along columns of the memory cells. In one conventional implementation, each memory cell is located at a cross point of a word line and a bit line.

Examples of magnetic memory cells include tunneling magnetoresistance (TMR) memory cells, giant magnetoresistance (GMR) memory cells, or colossal magnetoresistance (CMR) memory cells. These types of memory cells are commonly referred to as spin valve memory (SVM) cells.

An SVM cell includes two magnetic layers that are separated by a dielectric layer. The orientation of magnetization of one of the magnetic layers can be altered, while the orientation of magnetization of the other magnetic layer is fixed or "pinned" in a particular orientation. The magnetic layer having alterable magnetization is typically referred to as a "data storage layer" or "sense magnetic layer," while the magnetic layer that is pinned is typically referred to as a "reference layer" or a "pinned magnetic layer." The dielectric layer is an insulating tunnel barrier sandwiched between the magnetic layers.

The SVM cell exhibits tunneling magnetoresistance (TMR), giant magnetoresistance (GMR), or colossal magnetoresistance (CMR), in the presence of the magnetic field provided by the magnetic layers. Relative orientation and magnitude of spin polarization of the magnetic layers determine the resistance of the SVM cell. Generally, resistance of the SVM cell is a first value R if the magnetic layers have a parallel magnetization orientation, and the resistance is increased to a second value R+ΔR if the magnetization orientation is changed from parallel to anti-parallel.

The two magnetization orientations, parallel and anti-parallel, of an SVM cell represent different data states, such as logical "0" and "1." The orientation may be changed from parallel to anti-parallel, or vice-versa, by applying the proper magnetic field to the SVM cell. Typically, the orientation of magnetization of a storage cell is a stable orientation that does not change until a magnetic field is applied to change the orientation of magnetization. Therefore, an MRAM device is able to provide non-volatile storage. The magnetization orientation of a selected memory cell is detected by measuring the resistance of the SVM cell associated with the selected memory cell.

Typically, an MRAM device includes sense amplifiers to detect states of memory cells. Some conventional sense amplifiers include digital comparators that perform comparison of states of a memory cell during a read operation. Analog-to-digital conversion is performed on signals received from the storage cell, with the outputs of the analog-to-digital conversion provided to the inputs of the digital comparator. The analog-to-digital conversion process performed at the inputs of the comparator is relatively time consuming, which may result in reduced read access speeds in MRAM devices that employ sense amplifiers with digital comparators.

DETAILED DESCRIPTION

Figure 1:
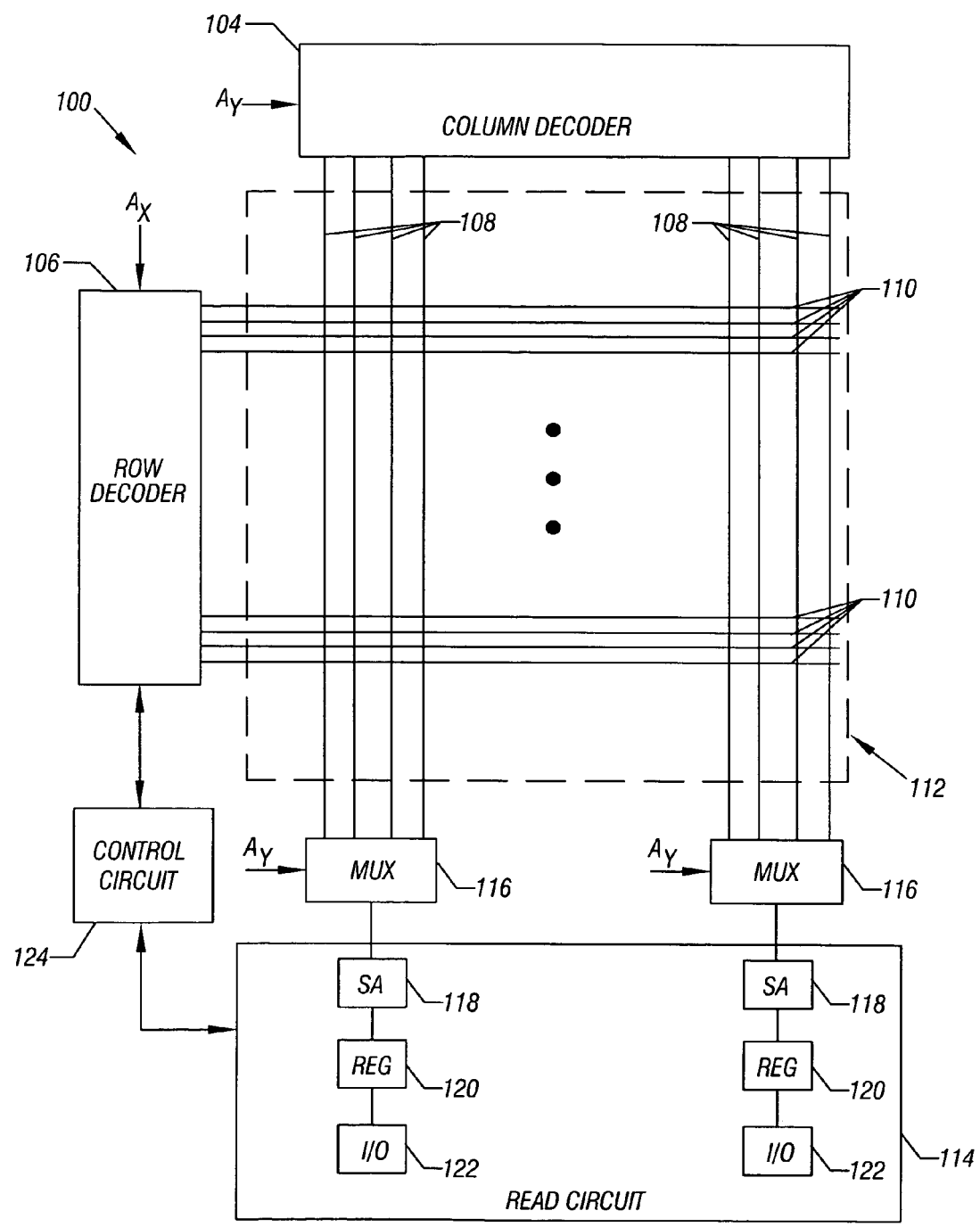
FIG. 1 is a block diagram of an embodiment of a magnetoresistive storage device.

FIG. 1 shows a magnetoresistive storage device 100, which in one example implementation is a magnetoresistive random access memory (MRAM) device that includes an array 112 of memory cells. Each memory cell is located at the intersection of a word line 110 and a bit line 108. The memory cells include magnetic elements, which according to some embodiments include magnetoresistive elements. A magnetoresistive element includes a material that changes resistance in the presence of a magnetic field.

The storage device 100 includes a row decoder 106 that drives word lines 110. When activated, a word line 110 causes a row of memory cells to be selected. Selection of a word line 110 is based on a row address $A_X$ received by the row decoder 106. The storage device 100 also includes a column decoder 104 that drives bit lines 108. Selection of a bit line 108 is based on column address bits $A_Y$ received by the column decoder 104.

The array of memory cells thus includes word lines extending along rows of the memory cells and bit lines extending along columns of the memory cells. Each memory cell may be located at a cross point of a word line and a bit line.

During a write operation, the row decoder 106 applies a write current to a selected word line 110, and a column decoder 104 causes a write current to be applied to selected one or more bit lines 108. Application of currents to the word line 110 and bit line(s) 108 causes generation of magnetic fields that cause memory cell(s) to be written to desired state(s).

During a read operation, the state of a selected memory cell is sensed by a sense circuit, such as sense amplifier (SA) 118. A "sense circuit" refers to a circuit to detect a state of a memory cell. Following this first sense phase of the read operation, the selected memory cell is written to a predetermined state. Following the write of the selected memory cell to the predetermined state, the state of the selected memory cell is sensed again for the purpose of determining whether the state of the selected memory cell has changed.

There is thus a dual purpose for each bit line 108 during a read operation. During the write phase of the read operation, the bit line 108 is used to provide current to orient the magnetization orientation of a selected memory cell. During the sense phases of the read operation, the bit line 108 is used to transfer a stored voltage from the selected memory cell to a sense amplifier 118. Detection of a change in the state of the selected memory cell as a result of the write to the predetermined state indicates that the memory cell stores a data bit having a first state (which is different from the predetermined state). However, if the state of the selected memory cell does not change in response to writing of the memory cell to the predetermined state, then that indicates that the memory cell stores a data bit having a second state (which is the same as the predetermined state). Moreover, during a read operation, if it is detected that the selected memory cell has changed state as a result of the write to the predetermined state, the memory cell is changed back to its original state by performing another write.

In a read operation, the state of a selected memory cell is determined by a read circuit 114. The read circuit 114 includes sense amplifiers 118 for detecting voltage levels of corresponding bit lines 108. A selected memory cell drives the respective bit line 108 to a voltage level that corresponds to the state of the selected memory cell.

Multiple bit lines 108 from the memory array 112 are connected to inputs of each of a plurality of multiplexers 116 (two multiplexers 116 are depicted in FIG. 1). Additional multiplexers (not shown) are connected to other sets of bit lines. Although FIG. 1 shows four bit lines 108 connected to each multiplexer 116, it is noted that in different implementations, the multiplexer 116 can receive a smaller number or a larger number of bit lines 108. The multiplexer 116 selects one of the bit lines 108 connected to the inputs of the multiplexer 116 based on certain column address bits $A_Y$. The output of the multiplexer 116 is provided to a corresponding sense amplifier 118.

The read circuit 114 further includes registers 120 and input/output (I/O) circuitry 122. The registers 120 are used for temporarily storing data that has been read by respective sense amplifiers 118 from selected memory cells of the array 112. The I/O circuitry 122 outputs data to output ports of the storage device 100.

The storage device 100 also includes a control circuit 124 that provides control signals such as timing signals to the row decoder 106, column decoder 104, and the read circuit 114. The control circuit 124 controls the sequencing of tasks to be performed during write and read operations.

Figure 2:
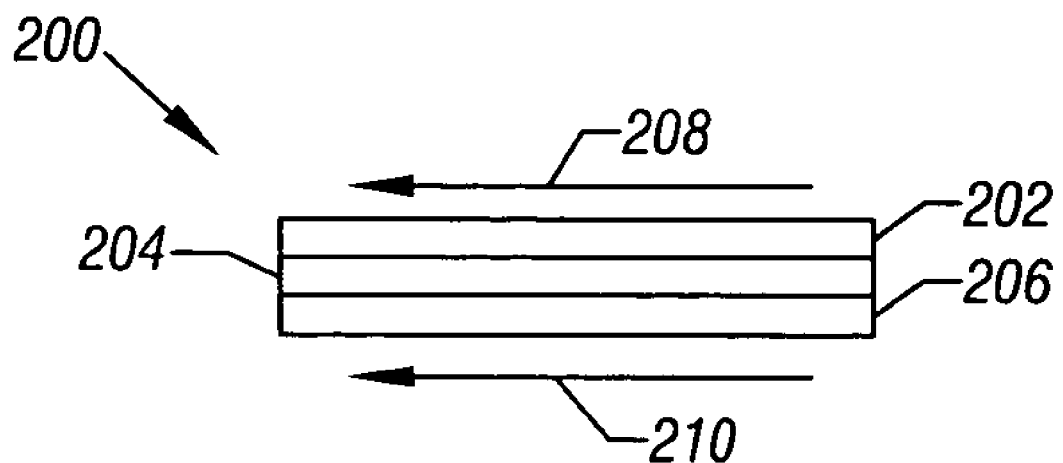
FIG. 2 illustrates a parallel magnetization orientation of a memory cell in the magnetoresistive storage device of FIG. 1.
Figure 3:
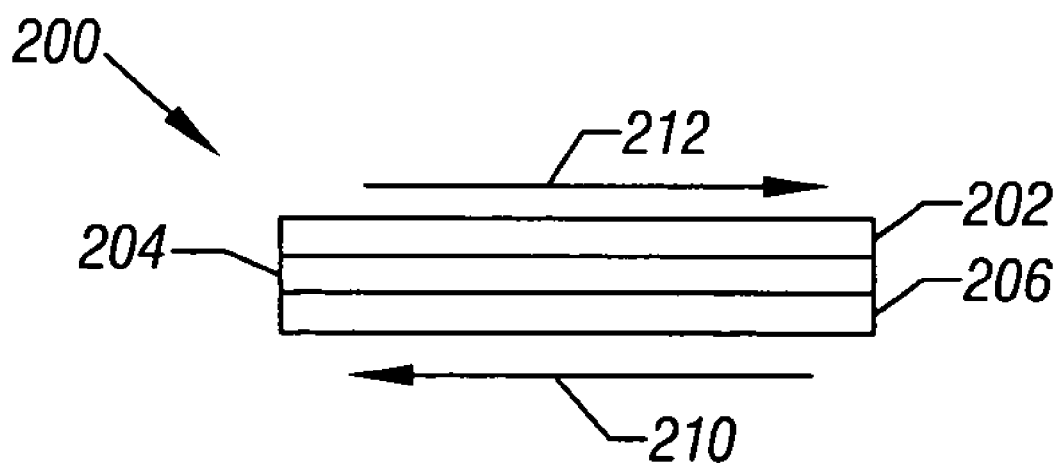
FIG. 3 illustrates an anti-parallel magnetization orientation of a memory cell in the magneto resistive storage device of FIG. 1.

FIGS. 2 and 3 illustrate the parallel and anti-parallel magnetization orientations of a memory cell 200. As noted above, a memory cell 200 is located at the intersection of a word line 110 and a bit line 108 (FIG. 1). The memory cell 200 includes first and second magnetic layers 202 and 206, and a dielectric layer 204 sandwiched between the magnetic layers 202 and 206. According to some embodiments, each of the magnetic layers 202 and 206 is formed of one of the following materials: nickel iron (NiFe), nickel iron cobalt (NiFeCo), cobalt iron (CoFe), alloys of such metals, or any other ferromagnetic or ferrimagnetic material. The dielectric layer 204 can be made of aluminum oxide ($Al_2O_3$), silicon dioxide ($SiO_2$), tantalum oxide ($Ta_2O_5$), silicon nitride ($SiN_4$), or any other insulating material that exhibits electron tunneling characteristics in the presence of a magnetic field.

According to one implementation, the magnetic layer 202 is a sense layer, and the magnetic layer 206 is a pinned layer. The pinned layer has a magnetization that is oriented in a plane (indicated by arrow 210). The pinned nature of the pinned layer is typically established with the use of anti-ferromagnetic (AFM) material in direct physical contact with a ferromagnetic (FM) material. AFM materials magnetically order below their Neel temperatures ($T_N$), the temperature at which they become anti-ferromagnetic or anti-ferrimagnetic. The Neel temperature of AFM materials is analogous to the Curie temperature ($T_C$) of FM materials, the temperature above which a FM loses its ability to possess an ordered magnetic state in the absence of an external magnetic field. Generally $T_C$ of the FM is greater than $T_N$ of the AFM. The magnetization of the pinned layer is fixed in the indicated direction so as not to rotate in the presence of an applied magnetic field within a predetermined range. The sense layer, on the other hand, has a magnetization that can be oriented in either of two directions in response to an applied magnetic field.

In a different implementation, a "soft" reference layer 206 (instead of a pinned or fixed reference layer) is used. The orientation of the soft reference layer 206 can be changed by application of magnetic fields.

In FIG. 2, the magnetization of the sense layer 202 is oriented in a direction indicated by the arrow 208. Thus, in the FIG. 2 arrangement, the sense layer and the pinned layer have a parallel magnetization orientation. However, as shown in FIG. 3, the sense layer has a magnetization that is oriented in an opposite direction, indicated by the arrow 212. In the FIG. 3 arrangement, the pinned and sense layers have an anti-parallel magnetization orientation.

The dielectric layer 204 provides an insulation tunneling barrier that allows quantum mechanical tunneling to occur between the magnetic layers 202 and 206. This tunneling phenomenon is electron spin dependent, making the resistance of a spin valve memory (SVM) cell (formed by the magnetic layers 202 and 206 and the dielectric layer 204) a function of the magnetization orientation of the sense and pinned layers. For instance, if the magnetization orientation of the pinned and sense layers is parallel, then the SVM cell has a first resistance R. The resistance of the SVM cell is increased to R+ΔR if the magnetization orientation is changed from parallel to anti-parallel. The parallel magnetization orientation depicted in FIG. 2 corresponds to a first logical state (e.g., logical "0"), and the anti-parallel magnetization orientation of FIG. 3 corresponds to a second storage state (e.g., logical "1"). In a different implementation, the parallel magnetization orientation can correspond to logical "1" while the anti-parallel magnetization orientation can correspond to logical "0."

Figure 4:
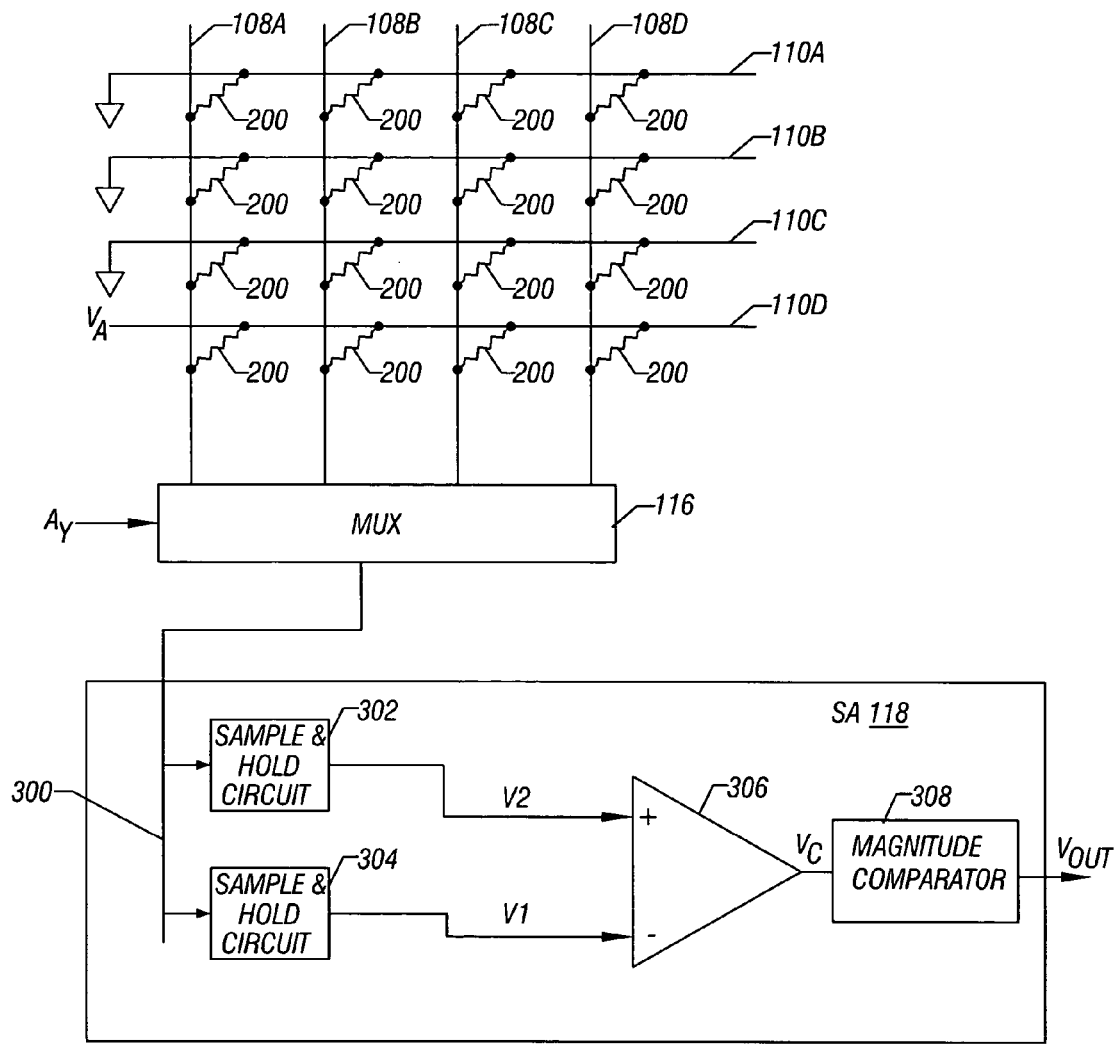
FIG. 4 is a schematic diagram of an arrangement of memory cells that are coupled to a sense amplifier, in accordance with an embodiment of the invention.

FIG. 4 shows an example arrangement of a 4×4 array of memory cells 200 (16 memory cells 200 depicted in FIG. 4). The memory cells 200 are selected by four word lines 110A, 110B, 110C, 110D, and four bit lines 108A, 108B, 108C, 108D. The four bit lines 108A, 108B, 108C, 108D, are connected to the inputs of a multiplexer 116. The output of the multiplexer 116 drives a column line 300 that is provided to a corresponding sense amplifier 118.

In the embodiment depicted in FIG. 4, the sense amplifier 118 includes two sample and hold circuits 302 and 304 (which make up one embodiment of a sampling circuit). The input of each sample and hold circuit 302, 304 is connected to the column line 300. The outputs of the sample and hold circuits 302 and 304 are connected to the inputs of a differential amplifier 306. The output of the sample and hold circuit 304 produces a signal V1, while the output of the sample and hold circuit 302 produces a signal V2. The plus (+) input of the differential amplifier 306 is connected to the output of the sample and hold circuit 302, and the minus (−) input of the differential amplifier 306 is connected to the output (V1) of the sample and hold circuit 304.

In accordance with some embodiments, the differential amplifier 306 is an analog differential amplifier (also referred to as an "analog comparator"). An "analog differential amplifier" or "analog comparator" refers to a differential amplifier that is able to detect differences in analog input voltages. Effectively, the analog differential amplifier or analog comparator compares different voltage samples (represented by V1 and V2) in their analog form.

Each sample and hold circuit 302, 304 can be implemented with a capacitor for temporarily storing a voltage detected on the column line 300 at different sense phases of a read operation. The differential amplifier 306 compares the voltages of signals V1 and V2 from the sample and hold circuits 304 and 302. The output of the comparison is provided by the differential amplifier 306 to a magnitude comparator 308. The magnitude comparator 308 produces an output signal $V_{OUT}$, which indicates the state of a selected memory cell. The magnitude comparator 308 can be implemented as an amplifier, which can perform analog-to-digital conversion of the output of the differential amplifier 306.

During a read operation, one of the word lines of the 4×4 array, such as word line 110D, is activated to a predetermined voltage, referred to $V_A$. The remaining word lines 110A, 110B, 110C, of the 4×4 array of memory cells is kept at a low voltage (e.g., a ground or other reference voltage). Depending on the state of column address bits $A_Y$, one of the bit lines 108A, 108B, 108C, and 108D is selected by the multiplexer 116 and provided to the column line 300.

During the first phase of the read operation, the selected memory cell 200 causes the corresponding bit line to be driven to a certain voltage depending upon the state (parallel or anti-parallel state) of the selected memory cell. This voltage of the bit line is transferred by the multiplexer 116 to the column line 300, which is sampled and held by the sample and hold circuit 304. Next, a write is performed to the selected memory cell, where the write causes the selected memory cell to be driven to a predetermined state. After the write to the predetermined state, the voltage level of the bit line corresponding to the selected memory cell is again sampled (in the second phase of read operation), this time by the sample and hold circuit 302. The differential amplifier 306 compares the voltages of the sample and hold circuits 302 and 304 to determine if the state of the selected memory cell has changed as a result of the write of the selected memory cell to the predetermined state.

In this manner, the differential amplifier 306 can quickly provide an indication of the comparison so that the sense amplifier 118 can provide an output signal $V_{OUT}$ to indicate the detected state of the selected memory cell. The inputs to the differential amplifier 306 are analog inputs that do not have to be first converted to a digital state, which can be time consuming. As a result, the sense amplifier 118 can perform detection of states of selected memory cells at a relatively fast rate.

Figure 5:
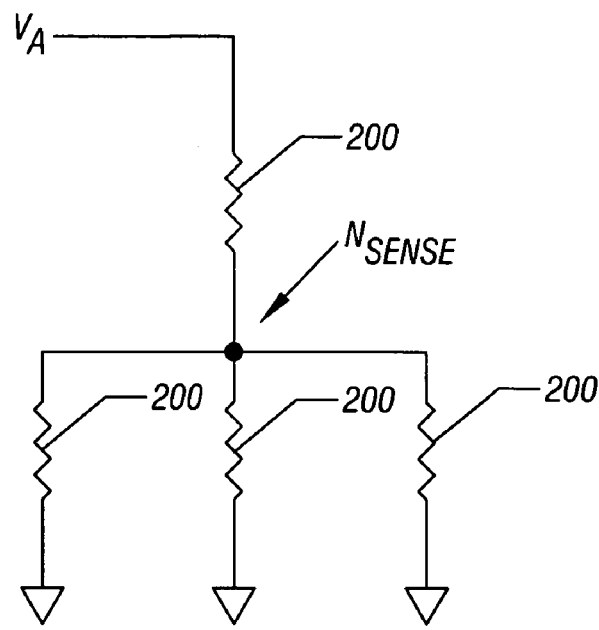
FIG. 5 is a circuit diagram illustrating the resistances of magnetoresistive memory cells coupled in a voltage divider arrangement, in accordance with an embodiment.

FIG. 5 illustrates a circuit diagram depicting an equivalent circuit that corresponds to a selected column of the 4×4 array of FIG. 4. In the 4×4 array, a column has four equivalent resistors (representing respective memory cells 200). The resistor corresponding to the selected memory cell is connected between the voltage $V_A$ (the voltage of the activated word line) and a sense node $N_{SENSE}$. The resistors corresponding to the unselected memory cells in the column are connected in parallel between $N_{SENSE}$ and ground. Thus, effectively, a voltage divider circuit is provided where the voltage level of $N_{SENSE}$ (which is the voltage of the selected bit line) is based on the relative values of the four resistors in the voltage divider arrangement.

In a different implementation that includes an M×M array of memory cells, where M has a value different from four, the voltage divider circuit of FIG. 5 would be modified to have the resistor corresponding to the selected memory cell above the $N_{SENSE}$ node, and M-1 resistors below the $N_{SENSE}$ node. Note that the array 112 of memory cells (FIG. 1) can include multiple sets of M×M array of cells.

Figure 6:
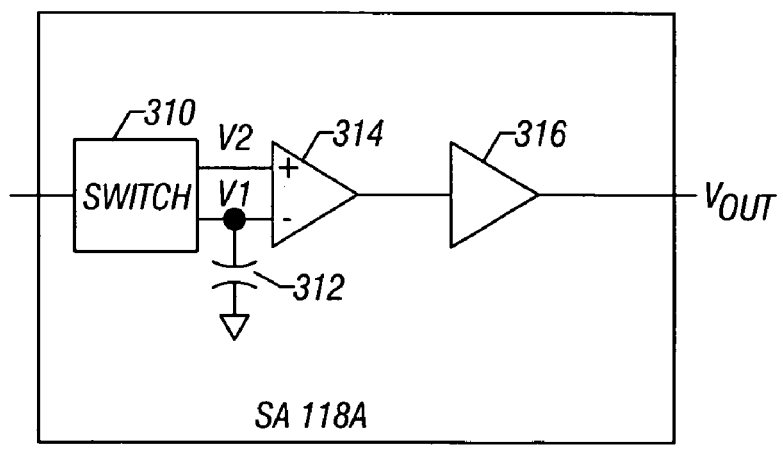
FIG. 6 is a schematic diagram of a sense amplifier, in accordance with a different embodiment.

FIG. 6 shows a sense amplifier 118A according to a different embodiment. In this alternative embodiment, instead of having two sample and hold circuits as depicted in FIG. 4, the sampling circuit includes one sample and hold circuit (in the form of a capacitor 312). The capacitor 312 is connected between signal V1 and ground, where V1 is connected to the − input of a differential amplifier 314 (also implemented as an analog differential amplifier). The + input of the differential amplifier 314 is connected to a V2 signal, where the V2 signal is not connected to a sample and hold circuit. The V1 and V2 signals are coupled to outputs of a switch 310, and the input of the switch 310 is connected to a column line (such as column line 300 in FIG. 4). The output of the differential amplifier 314 is provided to the input of an amplifier 316 (which converts the analog output of the differential amplifier 314 to a digital output level). The output of the amplifier 316 is the output signal $V_{OUT}$.

Operation of the sense amplifier 118A is similar to the operation of the sense amplifier 118 of FIG. 4. During the first sense phase of a read operation, the voltage level on the column line is provided through the switch 310 to signal V1 for temporary storage by the capacitor 312. Following a write of the selected memory cell to the predetermined state, the voltage level of the column line is routed by the switch 310 to the V2 signal. The differential amplifier 314 compares the voltage levels of the V1 and V2 signals, and provides an output indicating the result of the comparison to the amplifier 316. By using one sample and hold circuit instead of two sample and hold circuits, the size of the sense amplifier 118 can be smaller than the size of the sense amplifier 118A depicted in FIG. 4. The decrease in the size of the sense amplifier 118A results in more efficient use of the layout of a support structure (such as a semiconductor substrate) on which the MRAM device is implemented.

Figure 7:
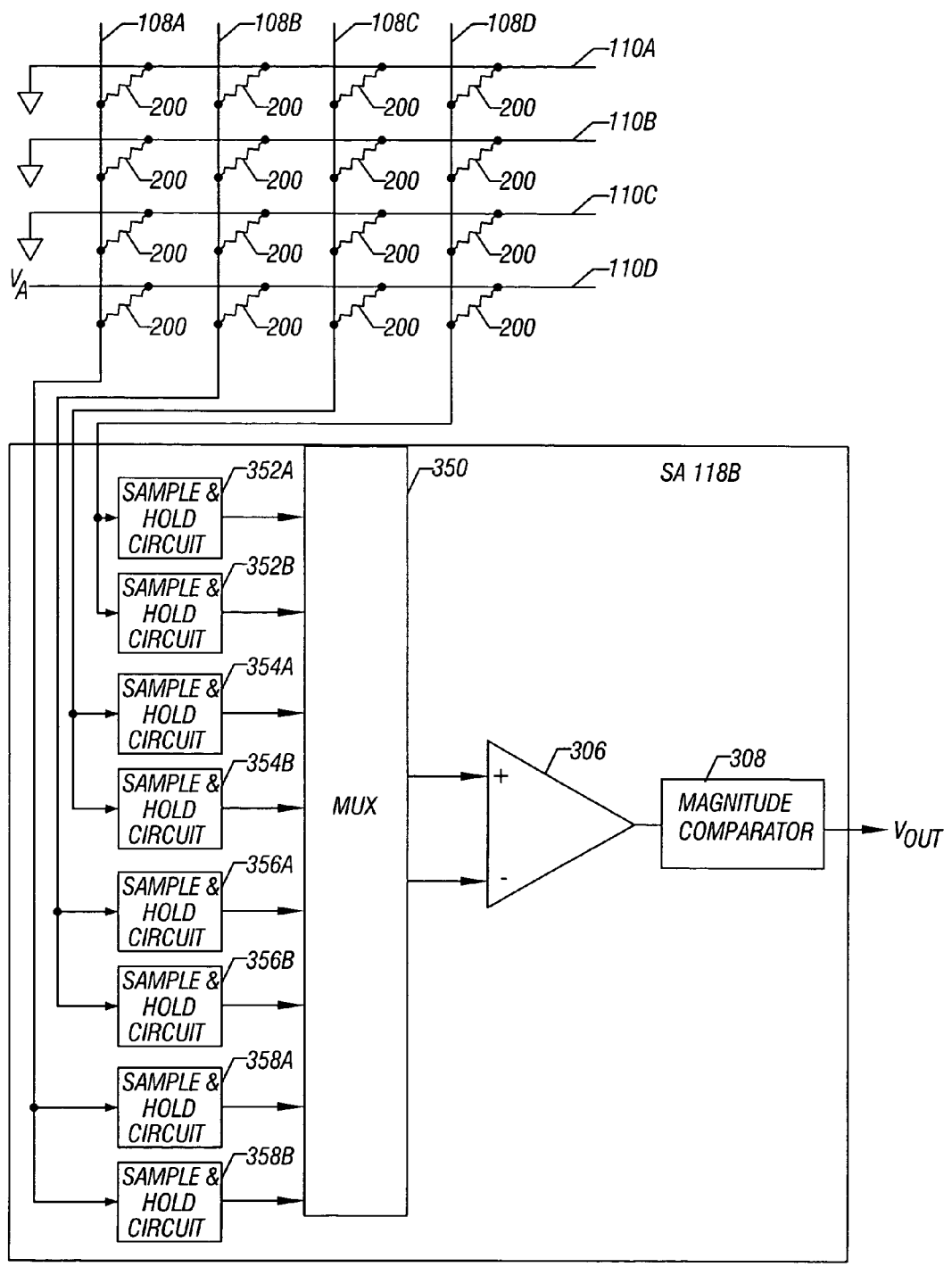
FIG. 7 is a schematic diagram of an arrangement of storage cells coupled to a sense amplifier according to yet another embodiment.

FIG. 7 illustrates yet another embodiment of a sense amplifier (referred to as 118B). In FIG. 7, the same 4×4 array of memory cells (depicted in FIG. 4) is provided. The 4×4 array of memory cells is connected to a sense amplifier 118B (but not through a multiplexer 116 as depicted in FIG. 4). In the arrangement of FIG. 7, bit line 108A is connected to a pair of sample and hold circuits 358A, 358B. The bit line 108B is connected to a pair of sample and hold circuits 356A, 356B. Bit line 108C is connected to a pair of sample and hold circuits 354A, 354B. The bit line 108D is connected to a pair of sample and hold circuits 352A, 352B. By using the arrangement of FIG. 7, the four bit lines 108A, 108B, 108C, and 108D, can be sampled in parallel in response to selection of a row (corresponding to word line 110D in FIG. 7). The outputs of the sample and hold circuits 352A, 352B, 354A, 354B, 356A, 356B, 358A, 358B (which make up yet another embodiment of a sampling circuit), are provided to inputs of a multiplexer 350. The multiplexer 350 selects one of the pairs of sample and hold circuits and provides the outputs of the selected pair of sample and hold circuits to the inputs of the differential amplifier 306. The output of the differential amplifier 306 is provided to the input of the magnitude comparator 308, which provides $V_{OUT}$. By reading four memory cells in parallel as depicted in FIG. 7, faster read access speeds can be achieved.

Figure 8:
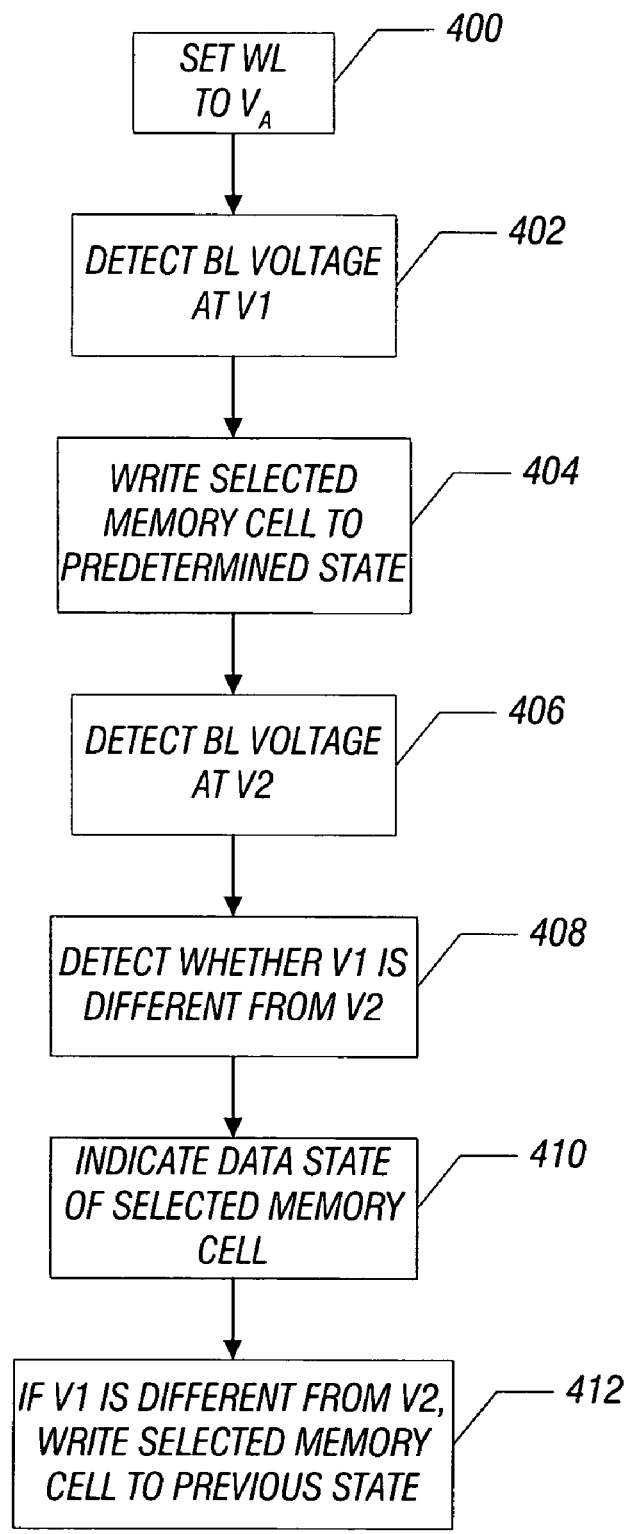
FIG. 8 is a flow diagram of a process of reading a state of a selected memory cell, in accordance with an embodiment.

Reference is made to FIGS. 4 and 8 in the following discussion. FIG. 8 is a flow diagram of a process of reading from a memory cell in FIG. 4. The control circuit 124 (FIG. 1) causes (at 400) a word line to be driven to a voltage $V_A$. In response to application of the voltage $V_A$ to a word line (e.g., word line 110D), the bit line 108A is driven to some voltage, which voltage is coupled by the multiplexer 116 to the sense amplifier 118. In the first phase of the read operation, a voltage corresponding to the bit line voltage is detected (at 402) by the sample and hold circuit 304.

Subsequently, the selected memory cell 200 is written to a predetermined state (at 404). The predetermined state can be either the parallel state or anti-parallel state. After the write operation is complete, a second sense phase is initiated, and the sense amplifier 118 detects (at 406) the voltage level of the bit line 108A at the sample and hold circuit 302. The differential amplifier 308 then detects (at 408) whether the voltage level of signal (VI) of the sample and hold circuit 304 is different from the voltage level of signal (V2) the sample and hold circuit 302 by greater than a predetermined amount. If the two voltage levels do not differ by greater than a predetermined amount, then the selected memory cell 200 is determined to store a data bit having the predetermined state. As a result, the magnitude comparator 308 outputs (at 410) the corresponding level on $V_{OUT}$. However, if the two voltage levels differ by greater than the predetermined amount, then the selected memory cell 200 is determined to store a data bit having a second state different from the predetermined state. In response, the comparator 308 outputs (at 410) a level on $V_{OUT}$ corresponding to the second state. If the two voltage levels of the two sample and hold circuits are different, then the control circuit 124 (FIG. 1) causes the selected memory cell 200 to be written back (at 412) to its previous state (which is the state of the selected memory cell 200 before the start of the read operation discussed here).

Figure 10A:
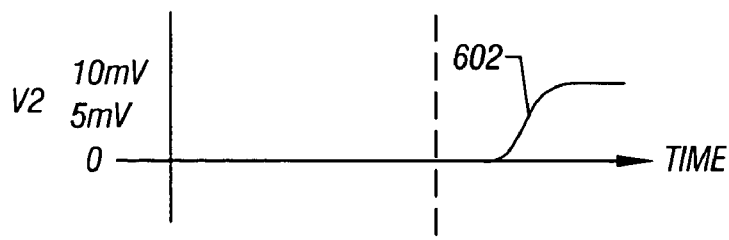
FIGS. 10A–10D and 11A–11D are timing diagrams of reading a memory cell.
Figure 10B:
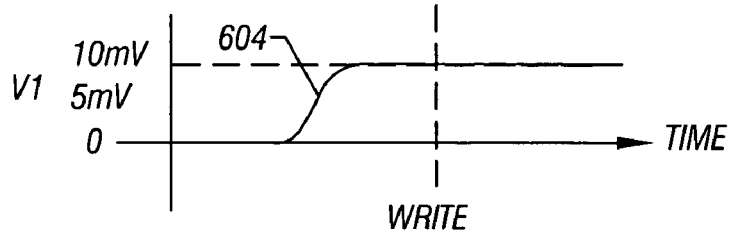
Figure 10C:
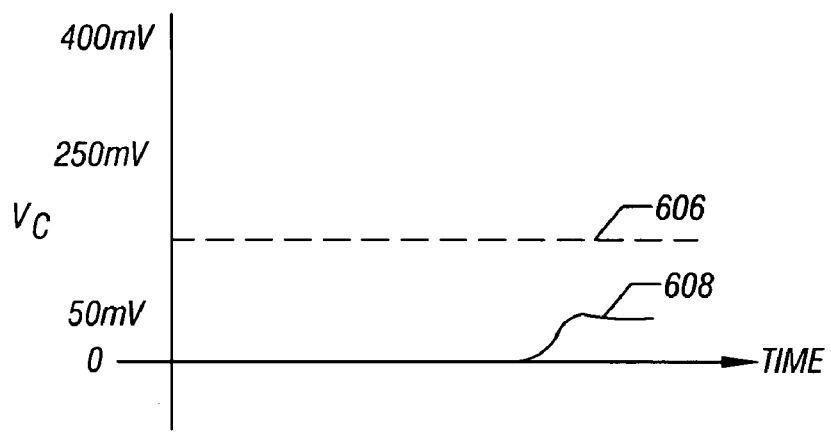
Figure 10D:
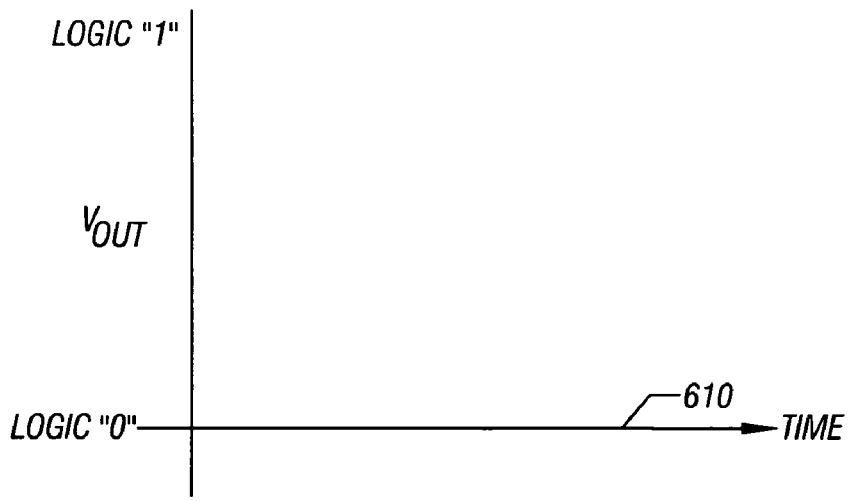
Figure 11A:
Figure 11B:
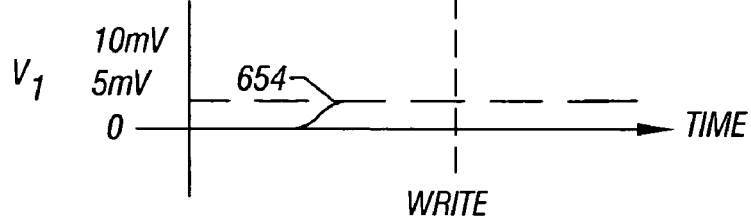
Figure 11C:
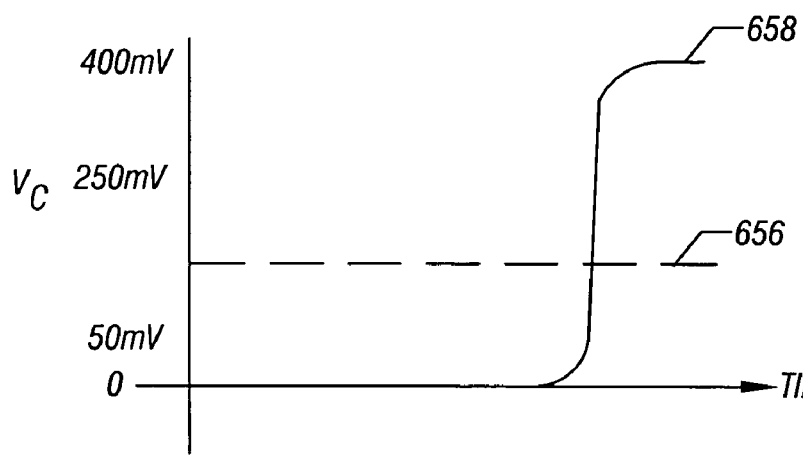
Figure 11D:
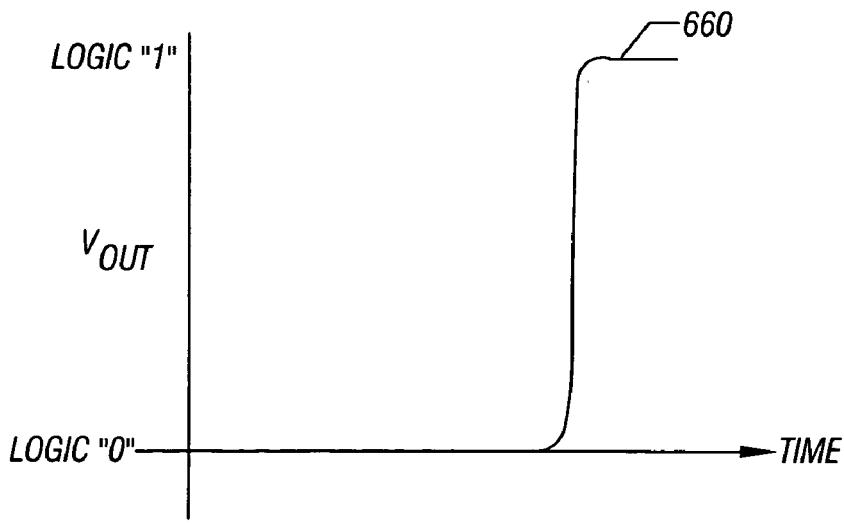

FIGS. 10A–10D illustrate timing diagrams of reading a memory cell. FIG. 10B depicts the state of voltage V1 (FIG. 4) upon reading the memory cell (represented by the rising edge 604). In this example, the memory cell is originally at a state that causes the voltage V1 to be driven to about 10 millivolts (mV). Note that the example voltages given here are provided for exemplary purposes, as other values can be used in other implementations. After detection and storage of the voltage V1, the memory cell is written to a known state, indicated by the dashed line labeled "WRITE." The read of the memory cell after the write to the known state is next performed (represented by the rising edge 602). This known state corresponds to the voltage V2 being driven to about 10 mV. The output $V_C$ of the analog comparator 306 (FIG. 4) is depicted in FIG. 1C. The voltage $V_C$ rises to a slightly raised state (608) in response to the rising edge 602 of V2. The slightly raised voltage at 608 is lower than a threshold 606 that defines the point at which the magnitude comparator 308 (FIG. 4) outputs either a low state or a high state. In response to $V_C$ being below the threshold 606, the magnitude comparator 308 outputs a low state. On the other hand, in response to $V_C$ being greater than the threshold 606, the magnitude comparator 306 outputs a high state. FIG. 10D depicts the voltage $V_{OUT}$ from the magnitude comparator 308. $V_{OUT}$ is at a logic "0" state in response to $V_C$ being less than the threshold 606. In this example, $V_{OUT}$ is detected to be logic "0" (indicated by 610) since a comparison of V1 and V2 after the write to the known state indicates that V1 and V2 have about the same voltage value (that is, V1 and V2 differ by less than some predetermined amount).

FIGS. 11A–11D illustrate a read operation where the initial value of the memory cell is different. In this case, upon the first reading of the memory cell, the voltage V1 is driven (at 654) to about 5 mV (FIG. 10B). After writing the memory cell to the known state (indicated by the dashed line labeled "WRITE"), the memory cell is read again. As a result, voltage V2 is driven (at 652) to about 10 mV (FIG. 10A). The voltage $V_C$ at the output of the analog amplifier 306 (FIG. 4) rises to a level indicated at 658 in response to the about 5 mV difference between V1 and V2 (in response to the rising edge of V2 at 652). The $V_C$ voltage at 658 is higher than a threshold 656. As a result, the voltage $V_{OUT}$ is driven to a logic "1" state in response to $V_C$ rising to greater than the threshold 656. In this case, $V_{OUT}$ is detected to be logic "1" (indicated by 660) since a comparison of V1 and V2 after the write to the known state indicates that V1 and V2 differ by greater than a predetermined amount.

Figure 9:
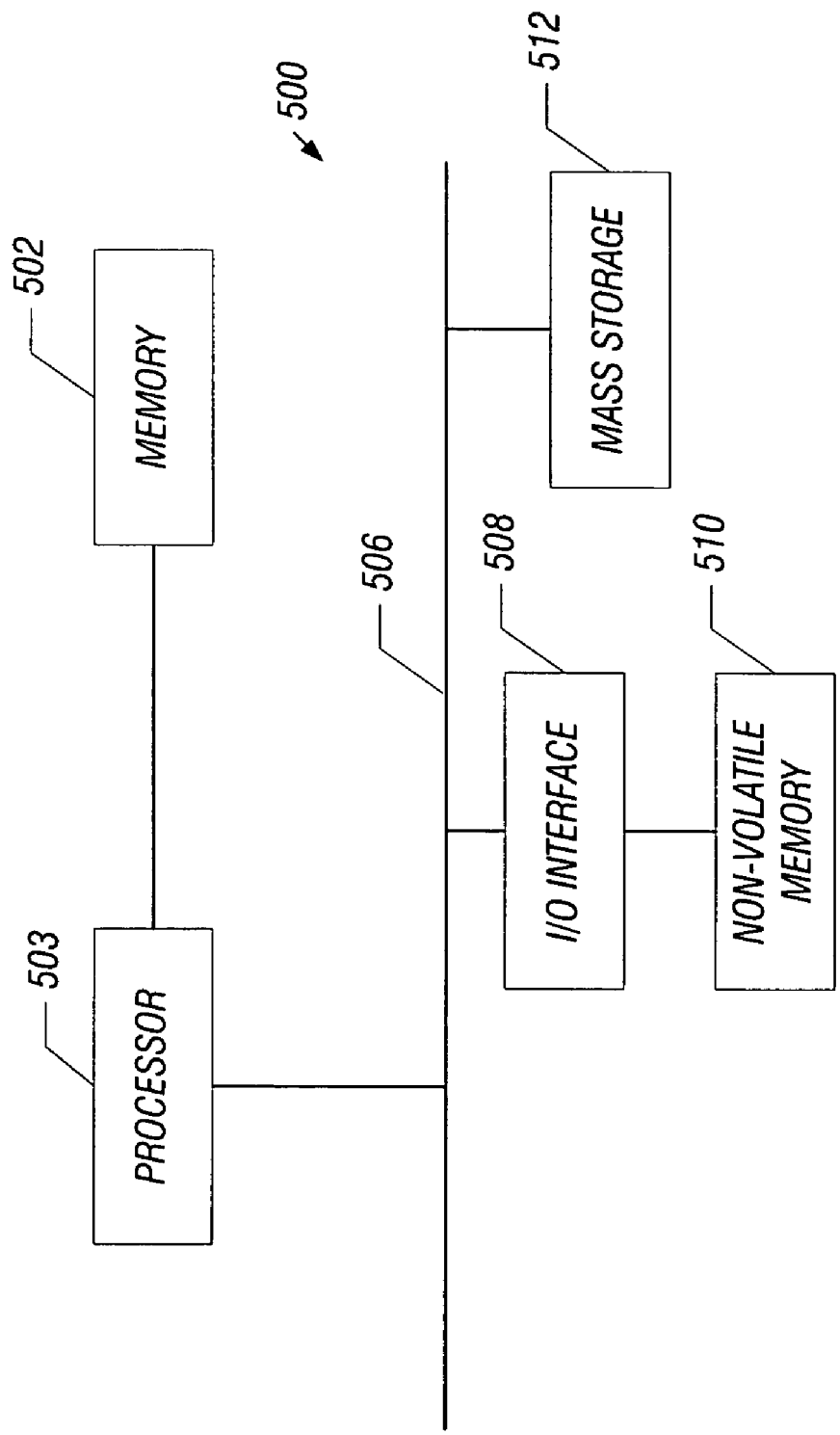
FIG. 9 is a block diagram of a system including a storage device according to an embodiment.

FIG. 9 shows a system 500 in which a storage device according to some embodiments of the invention can be incorporated. For example, a memory 502 of the system 500 can be a magnetoresistive storage device according to an embodiment. Similarly, a non-volatile memory 510 can also be a magnetoresistive storage device according to an embodiment. The memory 502 is connected to a processor 503, which is in turn connected to a bus 506. The system 500 also includes input/output (I/O) interface 508 connected to the bus 506 and the non-volatile memory 510. A mass storage device 512 is also connected to the bus. The arrangement of the system 500 of FIG. 6 is provided as an example only, as other embodiments can employ other system arrangements.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A storage device comprising:
   memory cells each having a magnetoresistive element; and
   a sense circuit coupled to a sense node of a group of the memory cells, the group of the memory cells arranged as a voltage divider;
   the sense circuit receiving signals from the sense node in respective phases of a read operation,
   the sense circuit having an analog comparator to compare the signals received from the sense node in the respective phases of the read operation.

2. The storage device of claim 1, wherein the voltage divider is formed by magnetoresistive elements corresponding to the memory cells in the group, the storage device further comprising word lines to select corresponding memory cells in the group,
   wherein one of the word lines is activated to select one of the memory cells in the group, the magnetoresistive element of the selected memory cell being connected between the sense node and a voltage of the activated word line, and the magnetoresistive elements of the other memory cells in the group being connected in parallel between the sense node and a reference voltage.

3. The storage device of claim 2, wherein the other word lines remain deactivated at the reference voltage.

4. The storage device of claim 1, wherein the memory cells are arranged in an array, the storage device further comprising:
   bit lines connected to the memory cells in the array; and
   a multiplexer having inputs connected to at least some of the bit lines, the multiplexer to select one of the bit lines at the inputs of the multiplexer to provide to the sense circuit.

5. The storage device of claim 4, further comprising:
   word lines connected to the memory cells in the array; and
   a row decoder to assert a first word line to an elevated word line voltage to select a row of memory cells in the array.

6. The storage device of claim 5, wherein a selected one of the bit lines makes up a column of memory cells, and wherein the group of the memory cells includes at least a portion of the column.

7. The storage device of claim 1, wherein the memory cells are arranged in a first array, the storage device further comprising:
   bit lines connected to the memory cells in the first array;
   word lines connected to the memory cells in the first array; and
   a row decoder to assert one of the word lines to an elevated word line voltage to select a row of memory cells in the first array,
   wherein the sense circuit includes plural sets of sample and hold circuits to sense, in parallel, voltages of corresponding plural bit lines in parallel.

8. The storage device of claim 7, further comprising:
   a second array of memory cells;
   second bit lines connected to the memory cells in the second array;
   a second sense circuit including plural sets of sample and hold circuits to sense, in parallel, voltages of corresponding plural second bit lines.

9. The storage device of claim 1, wherein the sense circuit has sample and hold circuits coupled to the sense node, outputs of the sample and hold circuits connected to inputs of the analog comparator.

10. The storage device of claim 9, wherein the sample and hold circuits comprise capacitors.

11. The storage device of claim 1, wherein the sense circuit has a sample and hold circuit connected to a first input of the analog comparator, the sample and hold circuit to sample a state of the sense node during a first phase of the read operation, and
    a second input of the analog differential amplifier to receive a state of the sense node during a second phase of the read operation.

12. The storage device of claim 1, wherein the sense circuit is adapted to:
    during a first sense phase of the read operation, receive a first signal from the sense node;
    during a write phase of the read operation, write a selected one of the memory cells in the group to a predetermined state;
    during a second sense phase of the read operation after the write phase, receive a second signal from the sense node,
    wherein the analog comparator is adapted to compare the first and second signals to determine a storage state of the selected memory cell.

13. A system comprising:
    a processor; and
    a storage device coupled to the processor, the storage device comprising:
      a group of memory cells each having a magnetoresistive element, the magnetoresistive elements of the memory cells in the group coupled in a voltage divider arrangement, the voltage divider arrangement providing a sense node; and
      a sense amplifier to receive a first signal from the sense node during a first sense phase of a read operation, and to receive a second signal from the sense node during a second sense phase of the read operation,
      the sense amplifier having an analog comparator to compare the first and second signals to determine a storage state of one of the memory cells in the group.

14. The system of claim 13, wherein the storage device further comprises word lines to select corresponding memory cells in the group,
    wherein one of the word lines is activated to select one of the memory cells in the group, the magnetoresistive element of the selected memory cell being connected between the sense node and a voltage of the activated word line, and the magnetoresistive elements of the other memory cells being connected in parallel between the sense node and a reference voltage.

15. The system of claim 14, wherein the other word lines remain deactivated at the reference voltage.

16. The system of claim 13, further comprising:
    an array of memory cells, wherein the group of memory cells is part of the array;
    bit lines connected to the memory cells in the array;
    word lines connected to the memory cells in the array; and
    a row decoder to assert a first word line to an elevated word line voltage to select a row of memory cells in the array.

17. The system of claim 16, wherein a selected one of the bit lines makes up a column of memory cells, the group of memory cells being at least part of the column.

18. The system of claim 16, wherein the sense amplifier includes plural sets of sample and hold circuits to sense, in parallel, voltages of corresponding plural bit lines.

19. The system of claim 18, wherein the sense amplifier further comprises:
- a multiplexer having inputs connected to outputs of the plural sets of the sample and hold circuits; and
- a magnitude comparator,
- the multiplexer to select one of the plural sets of the sample and hold circuits for providing output to the magnitude comparator.

20. The system of claim 13, wherein the sense amplifier has a sample and hold circuit connected to a first input of the analog comparator, the sample and hold circuit to sample a state of the sense node during the first sense phase of the read operation, and
- a second input of the analog differential amplifier to receive a state of the sense node during a second sense phase of the read operation.

21. A method comprising:
- storing data in memory cells of a storage device, the memory cells each having a magnetoresistive element, wherein a group of the memory cells are arranged such that the magnetoresistive element of a selected one of the memory cells in the group is connected between a first voltage and a sense node, and the magnetoresistive elements of un-selected memory cells in the group are connected in parallel between the sense node and a second voltage;
- receiving plural signals from the sense node in respective plural sense phases of a read operation; and
- comparing the received plural signals, with an analog comparator, to determine a storage state of the selected one of the memory cells in the group.

22. The method of claim 21, wherein plural word lines are connected to the memory cells in the group, the method further comprising:
- activating one of the plural word lines to the first voltage to select one of the memory cells in the group; and
- maintaining deactivated the other word lines, the other word lines at the second voltage.

23. The method of claim 22, wherein maintaining deactivated the other word lines comprises maintaining the other word lines at a ground voltage.

24. A storage device comprising:
- memory cells each including a magnetic element, the memory cells including a first memory cell connected between a first voltage and a sense node, and at least second and third memory cells connected in parallel between the sense node and a reference voltage; and
- a sampling circuit coupled to the sense node, the sampling circuit configured to receive a first voltage sample corresponding to an original state of the first memory cell, and to store a second voltage sample corresponding to a known state of the first memory cell after the first memory cell has been written to the known state; and
- a differential amplifier to compare the first and second voltage samples in their analog forms.

25. The storage device of claim 24, further comprising a magnitude comparator to output an indication of a state of the first memory cell based on the comparison by the differential amplifier.

26. The storage device of claim 24, wherein the sampling circuit comprises:
- a first sample and hold circuit coupled to the sense node for storing the first voltage sample; and
- a second sample and hold circuit coupled to the sense node for storing the second voltage sample.

27. The storage device of claim 24, wherein the sampling circuit comprises:
- a switch configured to route the first voltage sample to a first input of the differential amplifier, and to route the second voltage sample to a second input of the differential amplifier; and
- a sample and hold circuit coupled to the sense node for storing the second voltage sample.

28. The storage device of claim 24, wherein the sampling circuit comprises:
- plural sets of sample and hold circuits to sense, in parallel, voltages of corresponding plural memory cells; and
- a multiplexer having inputs connected to outputs of the plural sets of the sample and hold circuits, the multiplexer to select one of the plural sets of the sample and hold circuits for providing output to the differential amplifier.

29. A method comprising:
- storing data in memory cells of a storage device, the memory cells each having a magnetic element, wherein a group of the memory cells is arranged such that a first memory cell in the group is connected between a first voltage and a sense node, and plural other memory cells in the group are connected in parallel between the sense node and a second voltage;
- sampling an original state of the first memory cell through the sense node to produce a first voltage sample;
- writing a known state to the first memory cell;
- resampling the first memory cell after the writing to produce a second voltage sample; and
- comparing the first and second voltage samples in their analog form to determine the state of the first memory cell.

30. The method of claim 29, wherein the comparing is performed with an analog differential amplifier.

31. The method of claim 29, further comprising:
- outputting a first logical state in response to determining that the first and second voltage samples differ by greater than a predetermined amount;
- outputting a second logical state in response to determining that the first and second voltage samples differ by less than the predetermined amount.

32. The method of claim 31, further comprising writing the first memory cell back to the original state of the first memory cell in response to determining that the first and second voltage samples differ by greater than the predetermined amount.

* * * * *